United States Patent
Ge et al.

(10) Patent No.: US 9,553,581 B2
(45) Date of Patent: Jan. 24, 2017

(54) PACKAGE-AWARE STATE-BASED LEAKAGE POWER REDUCTION

(71) Applicant: FREESCALE SEMICONDUCTOR, INC., Austin, TX (US)

(72) Inventors: Zhe Ge, Suzhou (CN); Zhiwei Lu, Suzhou (CN); Miaolin Tan, Suzhou (CN)

(73) Assignee: FREESCALE SEMICONDUCTOR, INC., Austin, TX (US)

(*) Notice: Subject to any disclaimer, the term of this patent is extended or adjusted under 35 U.S.C. 154(b) by 0 days.

(21) Appl. No.: 14/929,383

(22) Filed: Nov. 1, 2015

(65) Prior Publication Data

US 2016/0329895 A1    Nov. 10, 2016

(30) Foreign Application Priority Data

May 7, 2015    (CN) .......................... 2015 1 0395672

(51) Int. Cl.
*H03K 19/00*      (2006.01)
*H03K 19/20*      (2006.01)

(52) U.S. Cl.
CPC .......... *H03K 19/0013* (2013.01); *H03K 19/20* (2013.01)

(58) Field of Classification Search
None
See application file for complete search history.

(56) References Cited

U.S. PATENT DOCUMENTS

| | | | |
|---|---|---|---|
| 7,302,652 B2 * | 11/2007 | Chen | G06F 17/5045 716/132 |
| 7,757,137 B2 | 7/2010 | Ortiz et al. | |
| 9,268,683 B1 * | 2/2016 | Cronie | G06F 12/0246 |
| 2004/0221185 A1 * | 11/2004 | Bose | G06F 1/3203 713/300 |
| 2006/0164888 A1 * | 7/2006 | Pisasale | G11C 5/147 365/185.18 |
| 2007/0164785 A1 * | 7/2007 | He | G06F 17/5054 326/41 |
| 2007/0168792 A1 | 7/2007 | Barowski | |
| 2010/0156458 A1 * | 6/2010 | Speers | H03K 19/17784 326/39 |
| 2012/0079249 A1 * | 3/2012 | Lien | G06F 9/3822 712/212 |
| 2013/0020707 A1 * | 1/2013 | Or-Bach | B82Y 10/00 257/741 |

(Continued)

*Primary Examiner* — Crystal L Hammond
(74) *Attorney, Agent, or Firm* — Charles E. Bergere

(57) ABSTRACT

A multi-module integrated circuit (IC) can be configured in different types of packages having different modules enabled or disabled. A module that can be disabled has driven circuitry that is known a priori to have a low-power input vector that places the driven circuitry into a low leakage power state. The module also has driving circuitry with one or more package-aware cells. The IC has a package-aware controller that generates control signals for the package-aware cells that ensure that the outputs from the package-aware cells are forced to particular values (i.e., either logical-0 or logical-1) that cause the low power input vector to be applied to the driven circuitry when the IC is assembled in a package in which the module is disabled. In this way, module leakage power is reduced for package types in which certain modules are disabled.

9 Claims, 8 Drawing Sheets

(56) References Cited

U.S. PATENT DOCUMENTS

2013/0139013 A1\* 5/2013 Jain .................. G01R 31/31857
  714/726
2013/0262944 A1   10/2013 Hossain
2014/0368235 A1\* 12/2014 Aoki ................ H03K 19/01858
  326/38
2016/0094224 A1\* 3/2016 Tamura ............. H03K 19/0013
  326/102

\* cited by examiner

PACKAGE-AWARE STATE-BASED LEAKAGE POWER REDUCTION

BACKGROUND

The present invention relates to integrated circuits and, more particularly, to integrated circuits that have disabled modules placed in a low leakage state.

It is known to design a multi-module integrated circuit (IC) for use in a variety of different types of IC packages (a.k.a. chips or packaged semiconductor devices), where certain package types might not use all of the available modules. In such package types, the unused modules are disabled. Even though the unused modules are disabled, they may still have significant levels of leakage power that, in some applications, such as in portable consumer electronic devices, may undesirably limit battery life between charging sessions.

BRIEF DESCRIPTION OF THE DRAWINGS

Embodiments of the invention will become more fully apparent from the following detailed description, the appended claims, and the accompanying drawings in which like reference numerals identify similar or identical elements.

DETAILED DESCRIPTION

Figure 2:
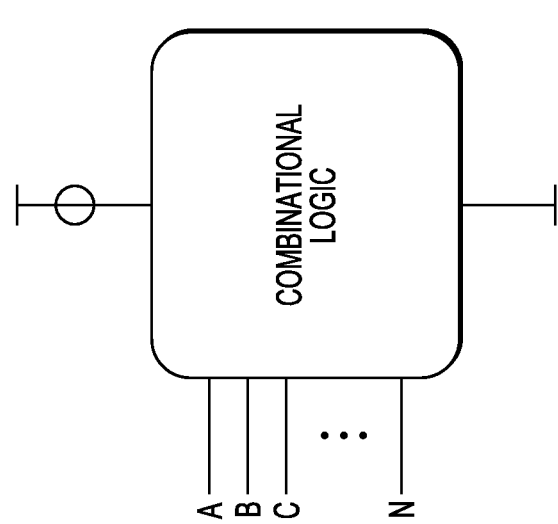
FIG. 2 is a high-level block diagram representing a generic, conventional combinational logic circuit with multiple inputs.

Detailed illustrative embodiments of the present invention are disclosed herein. However, specific structural and functional details disclosed herein are merely representative for purposes of describing example embodiments of the present invention. The present invention may be embodied in many alternate forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "includes," and/or "including," specify the presence of stated features, steps, or components, but do not preclude the presence or addition of one or more other features, steps, or components. It also should be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In one embodiment, the invention is an integrated circuit for use in any of multiple different package types. The IC comprises a plurality of modules and a package-aware controller. When used in a package of a first package type, a first module of the IC is enabled, and, when used in a package of a second package type, the first module is disabled. The first module comprises (i) a first set of driven circuitry configured to receive an input vector of input values, wherein a low-power input vector has a set of input values that places the first set of driven circuitry into a low-leakage-power state and (ii) a first set of driving circuitry configured to generate the input vector for the first set of driven circuitry, wherein the first set of driving circuitry comprises one or more package-aware cells. The package-aware controller is connected to generate package-aware control signals for the one or more package-aware cells. When the IC is assembled in the package of the second package type having the first module disabled, the package-aware controller is configured to generate the package-aware control signals for the one or more package-aware cells to cause the first set of driving circuitry to generate the low-power input vector that places the disabled first module into its low-leakage-power state.

In another embodiment, the invention is a method comprising (a) generating an initial design of an IC for use in any of multiple different package types, the IC comprising a first module having a first set of driven circuitry connected to be driven by a first input vector generated by a first set of driving circuitry of the IC; (b) performing power analysis to determine a low-power input vector that places the first set of driven circuitry in a low-leakage-power state; and (c) updating the design of the IC by modifying one or more cells in the first set of driving circuitry to be package-aware cells that are configured to receive package-aware control signals from a package-aware controller of the IC. When the IC is assembled in a package in which the first module is disabled, the package-aware controller is configured to generate the package-aware control signals to the one or more package-aware cells in the first set of driving circuitry to cause the first set of driving circuitry to generate the low-power input vector that places the first set of driven circuitry in its low-leakage-power state.

Figure 1:
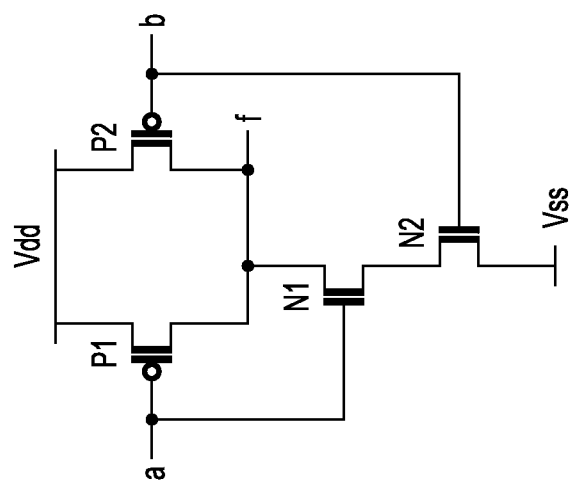
FIG. 1 is a schematic circuit diagram of a conventional logical-NAND cell.

FIG. 1 is a transistor-level diagram of a conventional logical-NAND cell 100 comprising two p-type transistors P1 and P2 and two n-type transistors N1 and N2. The NAND cell 100 receives two inputs a and b and generates an output f, whose logical value is the result of applying the logical NAND operation to the logical values of the inputs a and b. In one possible implementation of NAND cell the 100, when a and b are both logical-0 (i.e., low voltage), the leakage power from the power supply Vdd to the ground Vss is about 12 picowatts (pW). When a is logical-0 and b is logical-1, the leakage power is about 58 pW; when a is logical-1 and b is logical-0, the leakage power is about 54 pW; and when a and b are both logical-1, the leakage power is about 152 pW. This relatively simple example is representative of the general principle that leakage power can be highly dependent on the input values applied to combinational logic circuitry.

FIG. 2 is a high-level block diagram representing a generic, conventional combinational logic circuit 200 with multiple inputs. As in the case of the NAND cell 100 of FIG. 1, the logic circuit 200 will typically have different levels of leakage power for different sets of values for the logic circuit's inputs {A, B, C, . . . , N}, including a particular set of input values (or possibly two or more different sets of input values) for which the leakage power in the logic circuit 200 will be minimized. There are known techniques for finding a particular set of input values that minimizes the leakage power of the logic circuit 200, including an exhaustive search that sequentially simulates each different possible set of input values.

Figure 3:
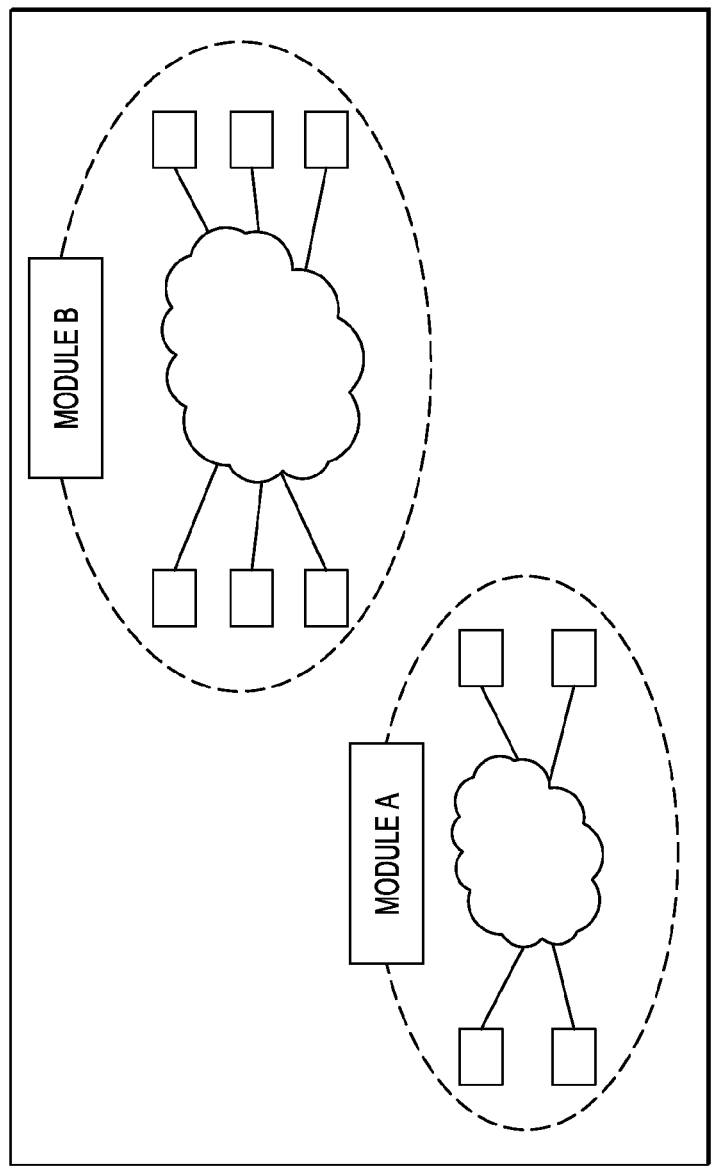
FIG. 3 is a simplified block diagram of an integrated circuit comprising modules A and B.

FIG. 3 is a simplified block diagram of an integrated circuit 300 comprising modules A and B and a number of other modules that are not explicitly shown in FIG. 3. The integrated circuit 300 can be configured in (at least) four different types of packages. In a first package type, all of the modules including the modules A and B are enabled; in a second package type, the module B is disabled, but the rest of the modules including the module A are enabled; in a third package type, the module A is disabled, but the rest of the modules including the module B are enabled; and, in a fourth package type, both modules A and B are disabled, but the rest of the modules are enabled.

According to certain embodiments of the invention, an integrated circuit is designed to include package-aware driving circuitry that is designed to generate a set of inputs to other, driven circuitry that places the driven circuitry into a low, if not the lowest, leakage-power state available for that driven circuitry. In particular and as described further below with respect to FIG. 4, the integrated circuit 300 of FIG. 3 has a first set of package-aware driving circuitry that is designed to generate a set of inputs that places the module A in its low-leakage-power state for the third and fourth package types in which the module A is disabled. In addition, the integrated circuit 300 has a second set of package-aware driving circuitry that is designed to generate a set of inputs that places the module B in its low-leakage-power state for the second and fourth package types in which the module B is disabled. Note that, in some cases, a set of circuitry can be both driven circuitry with respect to other circuitry upstream and driving circuitry with respect to other circuitry downstream.

Figure 4:
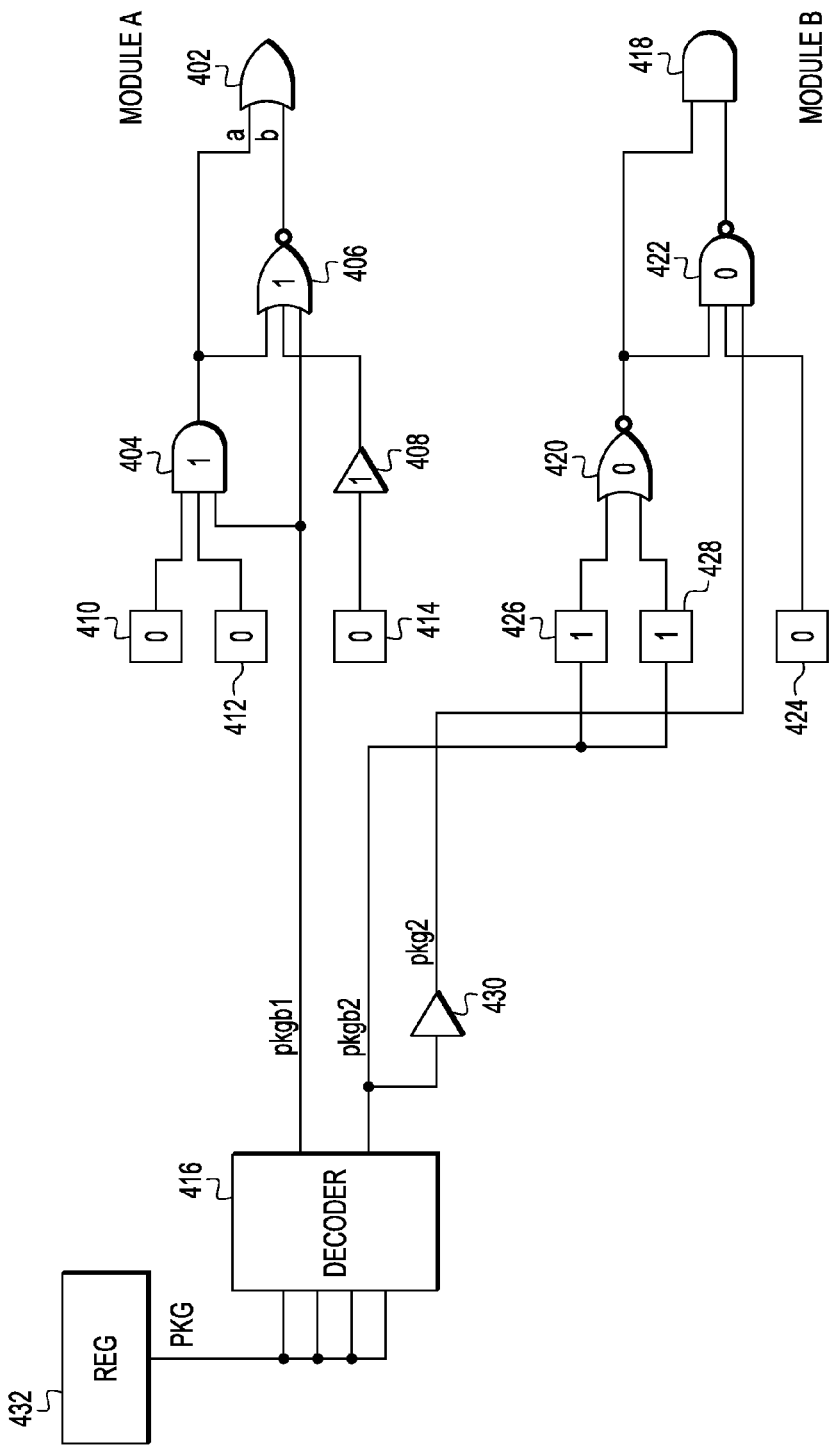
FIG. 4 is a schematic diagram of a portion of the integrated circuit of FIG. 3.

FIG. 4 is a schematic diagram of a portion of the integrated circuit 300 of FIG. 3, according to one relatively simple example of the present invention. In particular, FIG. 4 shows package-aware circuitry associated with the modules A and B of FIG. 3.

In this relatively simple example, the module A comprises a logical-OR cell 402 driven by a logical-AND cell 404 and a logical-NOR cell 406. The NOR cell 406 is itself driven by the AND cell 404 and also by a logical-NOT cell (aka inverter) 408. The AND cell 404 is driven by the two registers 410 and 412, while the NOT cell 408 is driven by the register 414.

In a conventional, prior-art implementation, when the module A is disabled, the registers 410, 412, and 414 will all have particular values (i.e., logical-0 or logical-1). In this example, when the module A is disabled, the registers 410, 412, and 414 all have values logical-0. In that case, the output of the AND cell 404 will also be logical-0, the output of the NOT cell 408 will be logical-1, and the output of the NOR cell 406 will be logical-0.

In this particular example, however, the OR cell 402 is known a priori to be in its lowest leakage-power state when its input values a and b are both logical-1. As such, according to the embodiment of FIG. 4, the module A is specifically designed such that the NOR cell 406 and the AND cell 404 are both package-aware circuits that receive a first complementary package-aware control signal pkgb1 in addition to their "normal" inputs. As described further below, a decoder 416 de-asserts (i.e., sets to logical-0) the control signal pkgb1 when the module A is disabled (e.g., for the third and fourth package types). When the module A is enabled (e.g., for the first and second package types), the decoder 416 asserts (i.e., sets to logical-1) the control signal pkgb1.

When the control signal pkgb1 is asserted, the output value generated by the AND cell 404 is determined by its other two inputs, and similarly the output value generated by the NOR cell 406 is determined by its other two inputs. However, when the control signal pkgb1 is de-asserted, the output value generated by the AND cell 404 will be forced to logical-1, and similarly the output value generated by the NOR cell 406 will also be forced to logical-1. In this way, the outputs of the package-aware AND cell 404 and the package-aware NOR cell 406 (i.e., package-aware driving circuitry) are forced to have values (i.e., both logical-1, in this case) that ensure that the OR cell 402 (i.e., the driven circuitry) is in its low-leakage-power state.

Note that, since the AND cell 404 generates an input to the NOR cell 406, the NOR cell 406 is itself driven circuitry that is driven by the driving circuitry of the AND cell 404 and the NOT cell 408. As such, the possibility exists of designing the NOR cell 406 to be in its low-leakage-power state when the module A is disabled. In that case, the AND cell 404 would be package-aware driving circuitry that places both the driven OR cell 402 and the driven NOR cell 406 into their respective low-leakage-power states when the module A is disabled.

Referring now to the module B of FIG. 4, the module B comprises a logical-AND cell 418 driven by a logical-NOR cell 420 and a logical-NAND cell 422. The NAND cell 422 is itself driven by the NOR cell 420 and the register 424, while the NOR cell 420 is driven by the two registers 426 and 428.

In a conventional, prior-art implementation, when the module B is disabled, the registers 424, 426, and 428 will all have particular values (i.e., logical-0 or logical-1). In this example, when the module B is disabled, the registers 424, 426 and 428 all have values logical-0. In that case, the output of the NOR cell 420 will be logical-1, and the output of the NAND cell 422 will be logical-1.

In this particular example, however, the AND cell 418 is known a priori to be in its lowest leakage-power state when its input values a and b are both logical-0. As such, according to the embodiment of FIG. 4, the module B is specifically designed such that the registers 426 and 428 are both package-aware circuits that receive a second complementary package-aware control signal pkgb2. In addition, the NAND cell 422 is also a package-aware circuit that receives a true package-aware control signal pkg2, where complementary control signal pkgb2 is the complement of the true control signal pkg2. As described further below, when the module B is disabled (e.g., for the second and fourth package types), the decoder 416 de-asserts the control signal pkgb2, and the inverter 430 inverts the control signal pkgb2 to assert the complement control signal pkg2. When the module B is enabled (e.g., for the first and third package types), the decoder 416 asserts the control signal pkgb2, and the inverter 430 de-asserts the control signal pkg2.

When the control signal pkgb2 is asserted and the control signal pkg2 is de-asserted (i.e., when the module B is enabled), the values provided by the registers 426 and 428 are based on their normal register programming, and the output value generated by the NAND cell 422 is determined by its other two inputs. However, when the control signal pkgb2 is de-asserted and the control signal pkg2 is asserted (i.e., when the module B is disabled), the values provided by the registers 426 and 428 will be forced to logical-1, and the output value generated by the NAND cell 422 will be forced to logical-0. In this way, the output of the NOR cell 420 is forced to be logical-0 by the package-aware registers 426 and 428, and the output of the package-aware NAND cell 422 is forced to be logical-0, which ensure that the AND cell 418 is in its low-leakage-power state. Here, the AND cell 418 is driven by the package-aware driving circuitry of the NAND cell 422, and the NOR cell 420 is driven by the package-aware driving circuitry of the registers 426 and 428.

Note that the package-aware registers 426 and 428 are (indirect) driving circuitry for both the NOR cell 420 and the NAND cell 422. As such, the possibility exists of designing the NOR cell 420 and/or the NAND cell 422 to be in their low-leakage-power states when the module B is disabled. In that case, the registers 426 and 428 would be package-aware driving circuitry that places the driven AND cell 418 as well as the driven NOR cell 420 and/or the driven NAND cell 422 into their respective low-leakage-power states when the module B is disabled.

As shown in FIG. 4, the decoder 416 generates the package-aware control signals pkgb1 and pkgb2 by decoding a value PKG stored in register 432. As shown in Table I, in one relatively simple implementation of the decoder 416, a PKG value of 0 corresponds to the first package type in which the modules A and B are both enabled. In this case, the decoder 416 decodes the value PKG=0 to generate pkgb1=1 and pkgb2=1, and none of the package-aware circuitry of the modules A and B are forced to output any particular values.

TABLE I

| Package Type | Module A | Module B | PKG | pkgb1 | pkgb2 | pkg2 |
|---|---|---|---|---|---|---|
| 1st | Enabled | Enabled | 0 | 1 | 1 | 0 |
| 2nd | Enabled | Disabled | 1 | 1 | 0 | 1 |
| 3rd | Disabled | Enabled | 2 | 0 | 1 | 0 |
| 4th | Disabled | Disabled | 3 | 0 | 0 | 1 |

Similarly, a PKG value of 1 corresponds to the second package type in which the module A is enabled and the module B is disabled. In this case, the decoder 416 decodes the value PKG=1 to generate pkgb1=1 and pkgb2=0, the package-aware circuitries of the registers 426 and 428 are both forced to output logical-1, and the NAND cell 422 is forced to output logical-0 to ensure that the AND cell 418 and possibly other cells are placed in their low-leakage-power states, while none of the package-aware circuitry of the module A are forced to output any particular values.

A PKG value of 2 corresponds to the third package type in which the module B is enabled and the module A is disabled. In this case, the decoder 416 decodes the value PKG=2 to generate pkgb1=0 and pkgb2=1, the package-aware circuitries of the AND cell 404 and the NOR cell 406 are both forced to output logical-1 to ensure that the OR cell 402 and possibly other cells are placed in their low-leakage-power states, while none of the package-aware circuitry of the module B are forced to any particular values.

Lastly, a PKG value of 3 corresponds to the fourth package type in which the modules A and B are both disabled. In this case, the decoder 416 decodes the value PKG=3 to generate pkgb1=0 and pkgb2=0, and all of the package-aware circuitry of the modules A and B are forced to output their corresponding particular values.

The decoder 416, the inverter 430, and the register 432 function as a package-aware controller for the integrated circuit 300.

Figure 5:
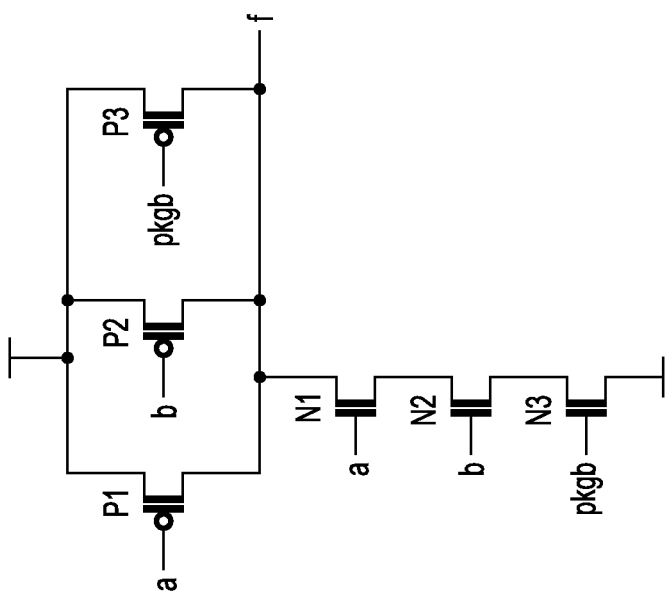
FIG. 5 is a transistor-level diagram of a package-aware logical-NAND cell according to one embodiment of the present invention in which the output f of the package-aware NAND cell is forced to logical-1 when the package-aware control signal pkgb is de-asserted.

FIG. 5 is a transistor-level diagram of a package-aware logical-NAND cell 500 according to one embodiment of the present invention in which the output f of the package-aware NAND cell 500 is forced to logical-1 when the package-aware control signal pkgb is de-asserted. The NAND cell 500 is a package-aware version of the NAND cell 100 of FIG. 1. When the module comprising the NAND cell 500 is enabled, the control signal pkgb is asserted, the transistor P3 is off, the transistor N3 is on, and the output f is a function of the input values a and b. When the module comprising the NAND cell 500 is disabled, the control signal pkgb is de-asserted, the transistor P3 is on, the transistor N3 is off, and the output f is forced to logical-1 independent of the input values a and b.

Figure 6:
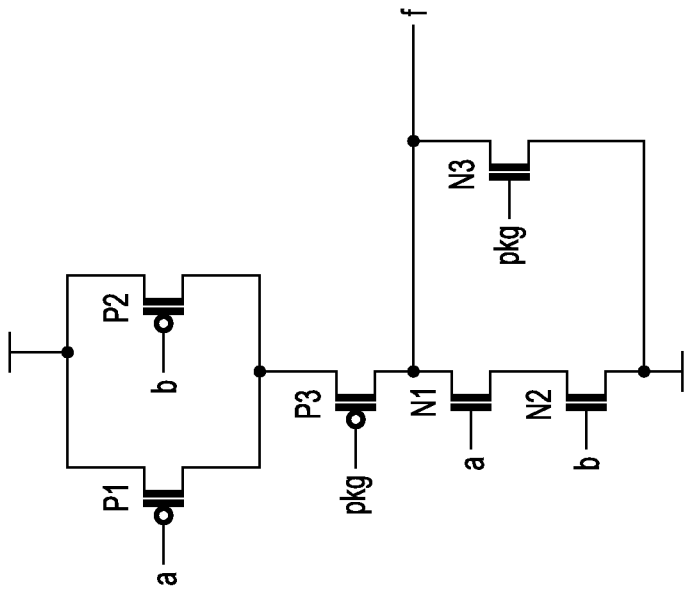
FIG. 6 is a transistor-level diagram of a package-aware logical-NAND cell according to another embodiment of the present invention in which the output f of the package-aware NAND cell is forced to logical-0 when the package-aware control signal pkg is asserted.

FIG. 6 is a transistor-level diagram of a package-aware logical-NAND cell 600 according to another embodiment of the present invention in which the output f of the package-aware NAND cell 600 is forced to logical-0 when the package-aware control signal pkg is asserted. The NAND cell 600 is a second, different package-aware version of the NAND cell 100 of FIG. 1 and can be used to implement the package-aware NAND cell 422 of FIG. 4. When the module comprising the NAND cell 600 is enabled, the control signal pkg is de-asserted, the transistor P3 is on, the transistor N3 is off, and the output f is a function of the input values a and b. When the module comprising the NAND cell 600 is disabled, the control signal pkg is asserted, the transistor P3 is off, the transistor N3 is on, and the output f is forced to logical-0 independent of the input values a and b.

Those skilled in the art will understand how to implement (i) package-aware versions of other logical cells, such as the "force to logical-1" package-aware AND cell 404 and the "force to logical-1" package-aware NOR cell 406 of FIG. 4.

Figure 7A:
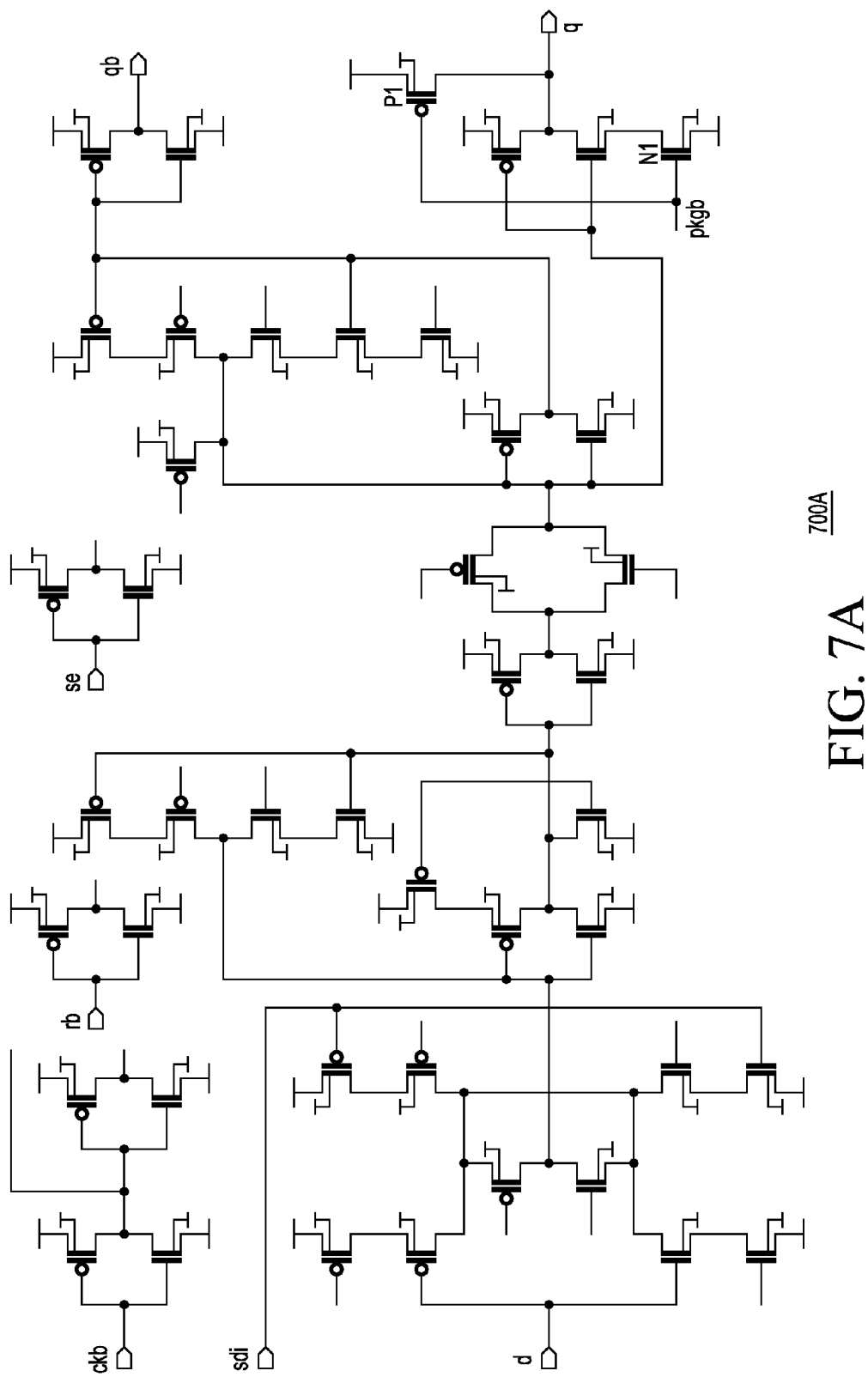
FIG. 7A is a transistor-level diagram of a package-aware register according to one embodiment of the present invention in which the true register output q of the package-aware register is forced to logical-1 when the package-aware control signal pkgb is de-asserted.

FIG. 7A is a transistor-level diagram of a package-aware register 700A according to one embodiment of the present invention in which the true register output q of the package-aware register 700 is forced to logical-1 when the package-aware control signal pkgb is de-asserted. The register 700 can be used to implement each of the package-aware registers 426 and 428 of FIG. 4. When the module comprising the register 700A is enabled, the control signal pkgb is asserted, the transistor P1 is off, the transistor N1 is on, and the true register output q is determined by the usual operations of the circuitry of the register 700A shown in FIG. 7, which will be understood by those skilled in the art. When the module comprising the register 700A is disabled, the control signal pkgb is de-asserted, the transistor P1 is on, the transistor N1 is off, and the true register output q is forced to logical-1 independent of the operations of the rest of the register circuitry.

Figure 7B:
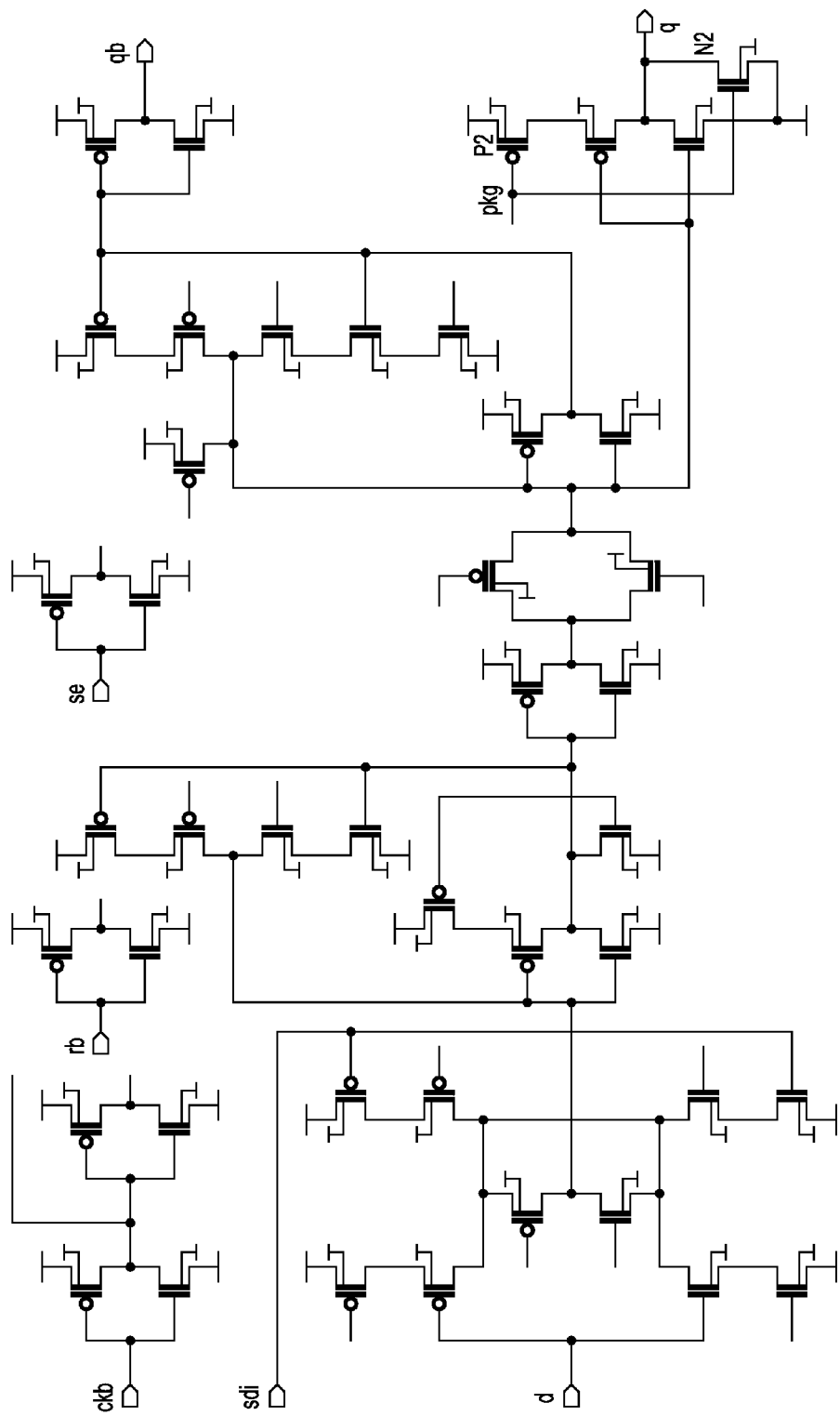
FIG. 7B is a transistor-level diagram of a package-aware register according to one embodiment of the present invention in which the true register output q of the package-aware register is forced to logical-0 when the package-aware control signal pkg is asserted.

FIG. 7B is a transistor-level diagram of a package-aware register 700B according to one embodiment of the present invention in which the true register output q of the package-aware register 700B is forced to logical-0 when the package-aware control signal pkg is asserted. When the module comprising the register 700B is enabled, the control signal pkg is de-asserted, the transistor P2 is on, the transistor N2 is off, and the true register output q is determined by the usual operations of the circuitry of the register 700B shown in FIG. 7B, which will be understood by those skilled in the art. When the module comprising the register 700B is disabled, the control signal pkg is asserted, the transistor P2 is off, the transistor N2 is on, and the true register output q is forced to logical-0 independent of the operations of the rest of the register circuitry.

Although not shown in FIGS. 7A and 7B, if it is necessary to force the value of the complementary register output qb to be either logical-0 or logical 1, then two transistors driven by either the control signal pkgb or the corresponding true control signal pkg can be added to the corresponding portion of the register circuitry. This will depend on whether any downstream circuitry is driven by the complementary register output qb and needs that output signal to have a particular value in order to place the downstream driven circuitry into its low-leakage-power state.

Figure 8:
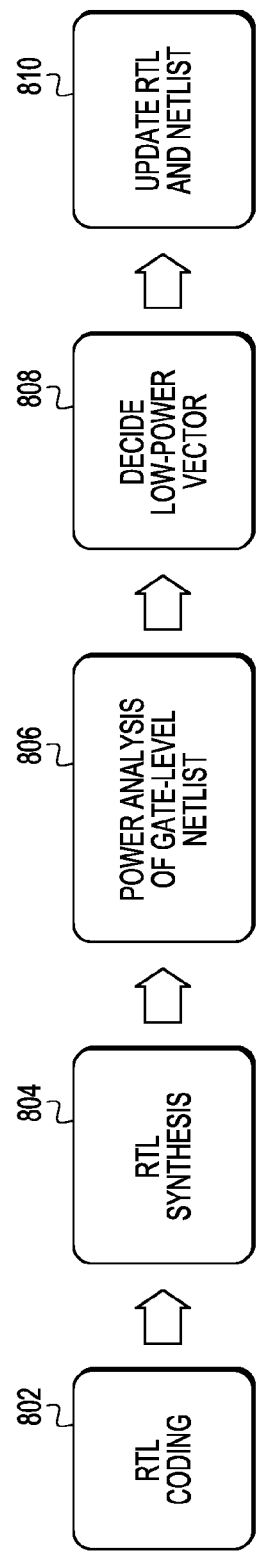
FIG. 8 is a flow diagram of one possible method for designing an integrated circuit of the present invention.

FIG. 8 is a flow diagram of one possible method for designing an integrated circuit of the present invention. In steps 802 and 804, conventional RTL (register-transfer level) coding and synthesis processing is performed to generate an initial (i.e., prior-art) design for the integrated circuit. In steps 806 and 808, leakage-power analysis is performed on the initial IC design for each IC module that will be disabled in at least one package types to determine a set of module input values (aka a low-power input vector) that places that module in its low-leakage-power state. In step 810, normal logic cells and registers are identified that need to be replaced by package-aware (either "forced to logical-0" or "forced to logical-1") versions in order to provide the determined low-power input vectors when the corresponding modules are disabled, and the RTL and netlist for the original IC design are accordingly updated to reflect the design modifications selected to provide the package-aware circuitry. The resulting IC design will have one or more modules with package-aware driving circuitry that will ensure that driven circuitry in those modules will be placed into its low-leakage-power state when the corresponding modules are disabled in certain package types for the IC.

Figure 9C:
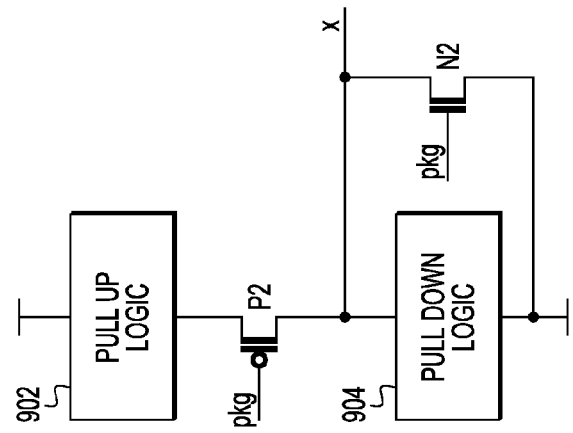
FIG. 9C is a schematic circuit diagram of a package-aware version of the logic cell of FIG. 9A whose output x is forced to logical-0 upon assertion of a package-aware control signal.
Figure 9B:
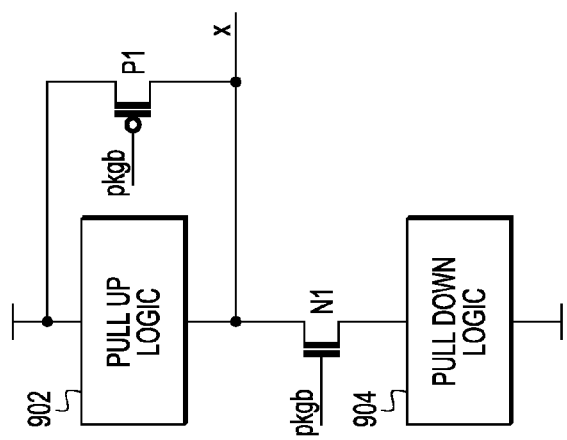
FIG. 9B is a schematic circuit diagram of a package-aware version of the logic cell of FIG. 9A whose output x is forced to logical-1 when the package-aware control signal pkgb is de-asserted.
Figure 9A:
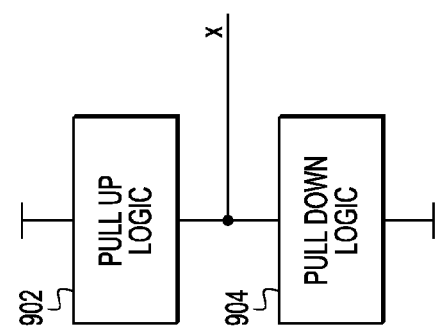
FIG. 9A is a schematic circuit diagram of a generic conventional logic cell.

FIG. 9A is a schematic circuit diagram of a generic conventional logic cell 900A comprising pull-up logic circuitry 902 and pull-down logic circuitry 904. The output x of the logic cell 900A is dictated by input values (not shown) applied to the pull-up and pull-down logic circuitries 902 and 904.

FIG. 9B is a schematic circuit diagram of a package-aware version 900B of the logic cell 900A of FIG. 9A whose output x is forced to logical-1 when the package-aware control signal pkgb is de-asserted. In that case, the transistor P1 is on, the transistor N1 is off, and the output x will be logical-1, independent of the input values (not shown) applied to the pull-up and pull-down logic circuitries 902 and 904. When the package-aware control signal pkgb is asserted, then the transistor P1 is off, the transistor N1 is on, and the package-aware logic cell 900A operates identical to the conventional logic cell 900A of FIG. A.

FIG. 9C is a schematic circuit diagram of a package-aware version 900C of the logic cell 900A of FIG. 9A whose output x is forced to logical-0 when the package-aware control signal pkg is asserted. In that case, the transistor P2 is off, the transistor N2 is on, and the output x will be logical-0, independent of the input values (not shown) applied to the pull-up and pull-down logic circuitries 902 and 904. When the package-aware control signal pkg is de-asserted, then the transistor P2 is on, the transistor N2 is off, and the package-aware logic cell 900A operates identical to the conventional logic cell 900A of FIG. A.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Also, for purposes of this disclosure, it is understood that all gates are powered from a fixed-voltage power domain (or domains) and ground unless shown otherwise. Accordingly, all digital signals generally have voltages that range from approximately ground potential to that of one of the power domains and transition (slew) quickly. However and unless stated otherwise, ground may be considered a power source having a voltage of approximately zero volts, and a power source having any desired voltage may be substituted for ground. Therefore, all gates may be powered by at least two power sources, with the attendant digital signals therefrom having voltages that range between the approximate voltages of the power sources.

Signals and corresponding nodes, ports, or paths may be referred to by the same name and are interchangeable for purposes here.

Transistors are typically shown as single devices for illustrative purposes. However, it is understood by those with skill in the art that transistors will have various sizes (e.g., gate width and length) and characteristics (e.g., threshold voltage, gain, etc.) and may consist of multiple transistors coupled in parallel to get desired electrical characteristics from the combination. Further, the illustrated transistors may be composite transistors.

As used in this specification and claims, the term "channel node" refers generically to either the source or drain of a metal-oxide semiconductor (MOS) transistor device (also referred to as a MOSFET), the term "channel" refers to the path through the device between the source and the drain, and the term "control node" refers generically to the gate of the MOSFET. Similarly, as used in the claims, the terms "source," "drain," and "gate" should be understood to refer either to the source, drain, and gate of a MOSFET or to the emitter, collector, and base of a bi-polar device when an embodiment of the invention is implemented using bi-polar transistor technology.

Unless explicitly stated otherwise, each numerical value and range should be interpreted as being approximate as if the word "about" or "approximately" preceded the value or range.

It will be further understood that various changes in the details, materials, and arrangements of the parts which have been described and illustrated in order to explain embodiments of this invention may be made by those skilled in the art without departing from embodiments of the invention encompassed by the following claims.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

The invention claimed is:

1. An integrated circuit (IC) for use in any of a plurality of different package types, the IC comprising:
    a plurality of modules, wherein:
        when assembled in a first package type, a first module of the IC is enabled; and
        when assembled in a second package type, the first module is disabled;
        wherein the first module comprises:
        a first set of driven circuitry configured to receive an input vector of input values, wherein a low-power input vector has a set of input values that places the first set of driven circuitry into a low-leakage-power state; and
        a first set of driving circuitry configured to generate the input vector for the first set of driven circuitry, wherein the first set of driving circuitry comprises one or more package-aware cells; and
    a package-aware controller connected to generate package-aware control signals for the one or more package-aware cells,
    wherein, when the IC is assembled in the second package type having the first module disabled, the package-aware controller is configured to generate the package-aware control signals for the one or more package-aware cells to cause the first set of driving circuitry to generate the low-power input vector that places the disabled first module into its low-leakage-power state.

2. The IC of claim 1, wherein a package-aware cell is a "force to 1" cell that generates an output signal of logical-1 when its package-aware control signal indicates that the first module is disabled.

3. The IC of claim 1, wherein a package-aware cell is a "force to 0" cell that generates an output signal of logical-0 when its package-aware control signal indicates that the first module is disabled.

4. The IC of claim 1, wherein the package-aware controller comprises:

a register configured to store a package-type value; and
a decoder connected to receive the package-type value from the register and decode the package-type value to generate the package-aware control signals for the one or more package-aware cells.

5. The IC of claim 1, wherein each package-aware cell comprises one or more transistors connected to receive corresponding package-aware control signals from the package-aware controller, wherein, when the first module is disabled, the one or more transistors force the output of the package-aware cell to cause the first set of driving circuitry to generate the low-power input vector for the first module.

6. The IC of claim 1, further comprising a second module that is enabled in one or more package types and disabled in one or more other package types, wherein the second module comprises:
    a second set of driven circuitry; and
    a second set of driving circuitry connected to generate a second input vector for the second set of driven circuitry, wherein the second set of driving circuitry comprises one or more other package-aware cells, and
    wherein the package-aware controller is connected to generate other package-aware control signals for the one or more other package-aware cells, wherein, when the IC is assembled in a package of a package type having the second module disabled, the package-aware controller is configured to generate the other package-aware control signals for the one or more other package-aware cells to cause the second set of driving circuitry to generate a low-power input vector that places the second set of driven circuitry into a low-leakage-power state.

7. The IC of claim 6, wherein:
    in the first package type:
        the first and second modules are both enabled; and
        the package-aware controller does not generate any package-aware control signals to force outputs of any of the package-aware cells in the first and second sets of driving circuitry;
    in the second package type:
        the first module is disabled and the second module is enabled; and
        the package-aware controller generates package-aware control signals to force outputs of the package-aware cells in the first set of driving circuitry, but not any outputs of the package-aware cells in the second set of driving circuitry;
    in a third package type:
        the first module is enabled and the second module is disabled; and
        the package-aware controller generates package-aware control signals to force outputs of the package-aware cells in the second set of driving circuitry, but not any outputs of the package-aware cells in the first set of driving circuitry; and
    in a fourth package type:
        the first and second modules are both disabled; and
        the package-aware controller generates package-aware control signals to force outputs of the package-aware cells in both the first and second sets of driving circuitry.

8. A method of designing an integrated circuit (IC), the method comprising:
    generating an initial design of an IC for use in any of multiple different package types, the IC comprising a first module having a first set of driven circuitry connected to be driven by a first input vector generated by a first set of driving circuitry of the IC;

performing power analysis on the initial design using an electronic design automation (EDA) tool to determine a low-power input vector that places the first set of driven circuitry in a low-leakage-power state; and updating the initial IC design by modifying one or more cells in the first set of driving circuitry to be package-aware cells that are configured to receive package-aware control signals from a package-aware controller of the IC, wherein, when the IC is assembled in a package in which the first module is disabled, the package-aware controller is configured to generate the package-aware control signals to the one or more package-aware cells in the first set of driving circuitry to cause the first set of driving circuitry to generate the low-power input vector that places the first set of driven circuitry in its low-leakage-power state.

9. The updated design of claim 8.

* * * * *